United States Patent
Katagiri et al.

(10) Patent No.: US 8,072,794 B2
(45) Date of Patent: Dec. 6, 2011

(54) SEMICONDUCTOR MEMORY DEVICE HAVING DRAM-COMPATIBLE ADDRESSING MODE AND DATA PROCESSING SYSTEM INCLUDING SAME

(75) Inventors: Satoshi Katagiri, Tokyo (JP); Kenji Mae, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/572,699

(22) Filed: Oct. 2, 2009

(65) Prior Publication Data

US 2010/0085804 A1 Apr. 8, 2010

(30) Foreign Application Priority Data

Oct. 2, 2008 (JP) ................................ 2008-257012

(51) Int. Cl.
*G11C 11/00* (2006.01)
(52) U.S. Cl. .... 365/148; 365/203; 365/205; 365/230.03
(58) Field of Classification Search .................. 365/148, 365/203, 205, 230.03
See application file for complete search history.

(56) References Cited

U.S. PATENT DOCUMENTS

| 7,154,788 | B2 | 12/2006 | Takemura et al. | |
| 7,643,334 | B1* | 1/2010 | Lee et al. | 365/163 |
| 2006/0013058 | A1* | 1/2006 | Kang et al. | 365/230.03 |
| 2008/0074931 | A1* | 3/2008 | Kim et al. | 365/185.29 |
| 2009/0027953 | A1* | 1/2009 | Kang et al. | 365/163 |
| 2009/0235014 | A1* | 9/2009 | Yim et al. | 711/103 |
| 2010/0027329 | A1* | 2/2010 | Lee et al. | 365/163 |

FOREIGN PATENT DOCUMENTS

JP 2005-158199 A 6/2005

\* cited by examiner

*Primary Examiner* — Hoai V Ho
(74) *Attorney, Agent, or Firm* — Sughrue Mion, PLLC

(57) ABSTRACT

In synchronism with an active command, a row address and a column address are simultaneously received, and a page address is received in synchronism with a read command or a write command. Word drivers select a word line based on the row address, and column switches select a bit line based on the column address. A page address decoder selects any one of read/write amplifiers corresponding to each page based on the page address. With this configuration, a specification for a DRAM such as an access cycle can be satisfied without arranging an amplifier for each bit line, and thus it becomes possible to secure a compatibility with a DRAM while reducing a chip area.

16 Claims, 13 Drawing Sheets

SEMICONDUCTOR MEMORY DEVICE HAVING DRAM-COMPATIBLE ADDRESSING MODE AND DATA PROCESSING SYSTEM INCLUDING SAME

BACKGROUND OF THE INVENTION

1. Field of the Invention

The present invention relates to a semiconductor memory device and a data processing system including the same, and, more particularly relates to a semiconductor memory device to which an address signal is input in a plurality of steps, and a data processing system including the same.

2. Description of Related Art

DRAM (Dynamic Random Access Memory), which is one of representative semiconductor memory devices, has a very large address space, and thus an address multiplex system in which an address signal is input in two steps is used. In this system, the number of address buses or of address terminals can be reduced.

Specifically, in synchronism with an active command, a block address (a mat address) and a row address are provided. Subsequently, in synchronism with a read command or a write command, a column address is provided. In this way, a memory cell to be accessed is specified. As a result, by the block address and the row address that are firstly provided, a memory cell array (also called a mat or a block) and a word line included in a selected memory cell array are selected, and by the column address that is secondly provided, a bit line is selected.

Such an address input system is predetermined depending on each specification. Therefore, in order that semiconductor memory devices other than the DRAM have a compatibility with a DRAM, it becomes essential for those semiconductor memory devices to adopt the above address input system. However, a semiconductor memory device in which the speed of a read operation or a write operation is slower than that of DRAMs, for example, a semiconductor memory device such as a PRAM (Phase Change Random Access Memory) in which a phase change material is used for a memory cell, has a problem in that it is not possible to automatically satisfy other specifications for DRAMs (particularly, an access cycle), and, even when the address input system is matched, it is not sufficient to secure a compatibility.

As a method of solving such a problem, Japanese Patent Application Laid-open No. 2005-158199 proposes a method in which a set operation (an operation in which a phase change material is changed from a highly resistant amorphous state to a low resistant crystalline state) of a memory cell that particularly requires a time is performed in the background.

However, there is a problem in that, to realize the method according to Japanese Patent Application Laid-open No. 2005-158199, there is a need of arranging a write amplifier for each bit line, and inevitably the area occupied by the write amplifiers on a chip becomes very large. That is, in a write operation in a PRAM, there is a need of applying a high voltage to the bit line and also supplying a relatively large writing current, and thus each of the write amplifiers occupies a very large area unlike a sense amplifier in the DRAM. Thus, it is not realistic to arrange the write amplifier for each bit line.

Such a problem occurs not only in PRAMs, but also in other semiconductor memory devices in which its write operation requires a long time.

SUMMARY

The present invention seeks to solve one or more of the above problems, or to improve upon those problems at least in part.

In one embodiment, there is provided a semiconductor memory device that includes: a plurality of memory cell arrays each including a plurality of word lines, a plurality of bit lines, and a plurality of memory cells each located at an associated intersection between the word lines and the bit lines; and an address selecting circuit that selects any one of the word lines and any one of the bit lines in each memory cell array based on first and second addresses provided in synchronism with a first command, and selects any one of the memory cell arrays based on a third address provided in synchronism with a second command issued after the first command.

In another embodiment, there is provided a data processing system that includes: a memory controller that simultaneously supplies the first and second addresses in synchronism with issuance of the first command and supplies the third address in synchronism with issuance of the second command; and the above-mentioned semiconductor memory device connected to the memory controller, wherein the semiconductor memory device receives the first address as a row address, receives the second address as a column address, and receives the third address as a page address.

According to the present invention, an address signal that is firstly input is handled as a row address and a column address, and an address signal that is secondly input is handled as a page address. Thus, from a memory controller side, the semiconductor memory device according to the present invention can be handled in an exactly same manner to that of a DRAM. Moreover, a word line and a bit line included in each memory cell array are selected by the address signal that is firstly input, and the memory cell array is selected by the address signal that is secondly input. Thus, the specification for a DRAM, such as an access cycle, can be satisfied without a need of arranging an amplifier for each bit line. Therefore, according to the present invention, a compatibility with a DRAM can be secured, and also a semiconductor memory device in which a chip area is reduced can be provided.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE EMBODIMENTS

Preferred embodiments of the present invention will be explained below in detail with reference to the accompanying drawings.

Figure 1:
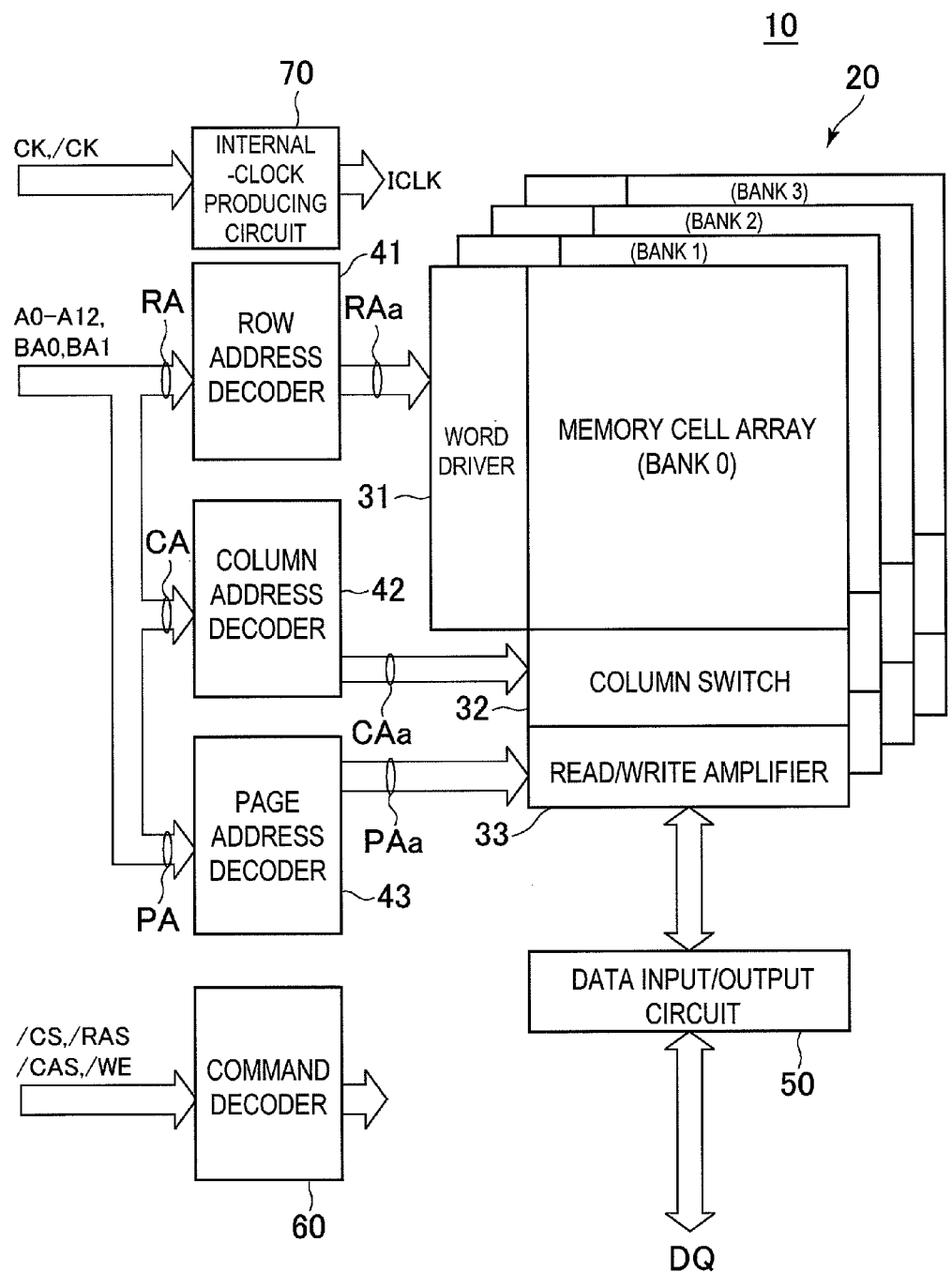
FIG. 1 is a block diagram of a semiconductor memory device 10 according to a first embodiment of the present invention.

FIG. 1 is a block diagram of a semiconductor memory device 10 according to a first embodiment of the present invention. The semiconductor memory device 10 according to the first embodiment is a PRAM in which a compatibility with a DRAM is secured. Therefore, it is possible to handle the semiconductor memory device 10 similarly to a DRAM from a memory controller side.

As shown in FIG. 1, the semiconductor memory device 10 includes a memory cell array 20 configured by a bank 0 to a bank 3, a word driver 31 that selects rows with respect to the memory cell array 20, a column switch 32 that selects columns with respect to the memory cell array 20, and read/write amplifier 33 that performs a read operation and a write operation with respect to the memory cell array 20. The bank 0 to the bank 3 configuring the memory cell array 20 can be independently operated based on commands different to one another, and selected by bank addresses BA0 and BA1.

The word driver 31 selects rows based on a decode signal RAa supplied from a row address decoder 41. The decode signal RAa is obtained by decoding a row address RA by the row address decoder 41. The row address RA is one portion of addresses A0 to A12 input from outside, and an address (a first address) input in synchronism with an active command.

The column switch 32 selects columns based on a decode signal CAa supplied from a column address decoder 42. The decode signal CAa is obtained by decoding a column address CA by the column address decoder 42. The column address CA is another portion of the addresses A0 to A12 input from outside, and an address (a second address) input in synchronism with an active command.

The read/write amplifier 33 activates an amplifier on a page selected based on a decode signal PAa supplied from a page address decoder 43. The decode signal PAa is obtained by decoding a page address PA by the page address decoder 43. The page address PA is one portion of the addresses A0 to A12 input from outside, and is an address (a third address) input in synchronism with a read command or a write command.

In the first embodiment, the word driver 31, the column switch 32, and the decoders 41 to 43 configure an address selecting circuit with respect to the memory cell array 20.

A read data DQ read by the read/write amplifier 33 is output to outside via a data input/output circuit 50. A write data DQ input from outside is supplied to the read/write amplifier 33 via the data input/output circuit 50.

The active command, the read command, and the write command are expressed by a combination of a chip select signal /CS, a row-address strobe signal /RAS, a column-address strobe signal /CAS, and a write enable signal /WE input from outside, and interpreted by a command decoder 60. A slash (/) assigned to the top of reference letter of each signal name means that the signal is low active.

Each signal (address and command) input from outside, the read data, and the write data DQ are all input and output in synchronism with clock signals CK, and /CK. The clock signals CK and /CK are supplied to an internal-clock producing circuit 70, and the internal-clock producing circuit 70 produces various types of internal clocks ICLK. The internal clocks ICLK are supplied to various types of internal circuits, and these internal circuits operate in synchronism with a corresponding one of the internal clocks ICLK.

Figure 2:
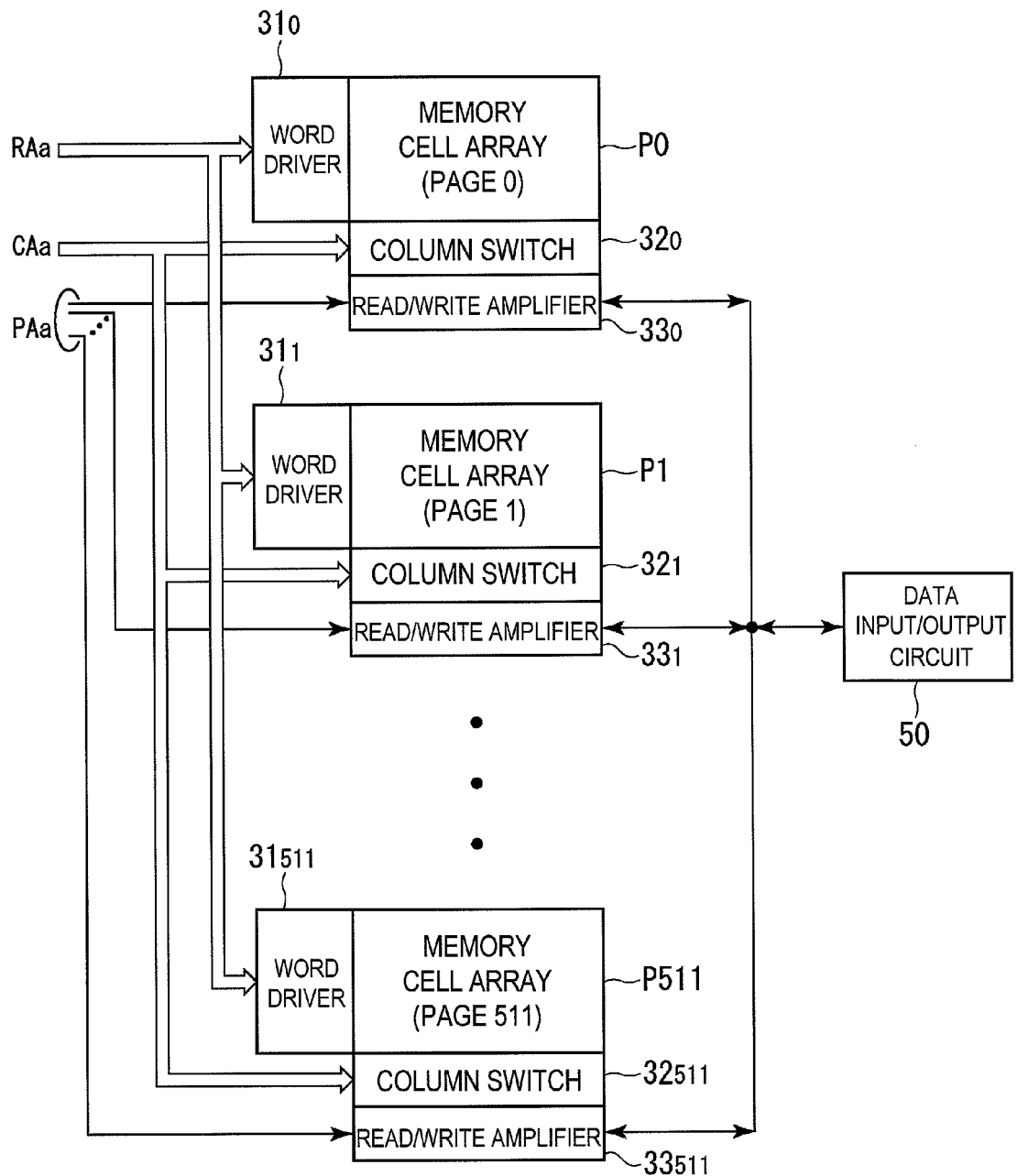
FIG. 2 is a block diagram showing a structure of the bank 0 of the memory cell array 20.

FIG. 2 is a block diagram showing a structure of the bank 0 of the memory cell array 20. Other banks 1 to 3 have the same structure as that of the bank 0.

As shown in FIG. 2, one bank of the memory cell array 20 is configured by 512 memory cell arrays P0 to P511. The word drivers 31, the column switches 32, and the read/write amplifiers 33 also are arranged for each of the memory cell arrays P0 to P511. In this case, word drivers $31_0$ to $31_{511}$ are commonly supplied the decode signal RAa, and column switches $32_0$ to $32_{511}$ are commonly supplied the decode signal CAa. Accordingly, when the row address RA and the column address CA are determined, the memory cell to which the same row address and column address are respectively allocated is selected within the memory cell arrays P0 to P511.

On the other hand, read/write amplifiers $33_0$ to $33_{511}$ are respectively supplied corresponding bits of the decode signal PAa. Accordingly, when the page address PA is determined, any one of the read/write amplifiers respectively allocated to the memory cell arrays P0 to P511 is selected. Input/output nodes of the read/write amplifier $33_0$ to $33_{511}$ are commonly connected to the data input/output circuit 50.

Figure 3:
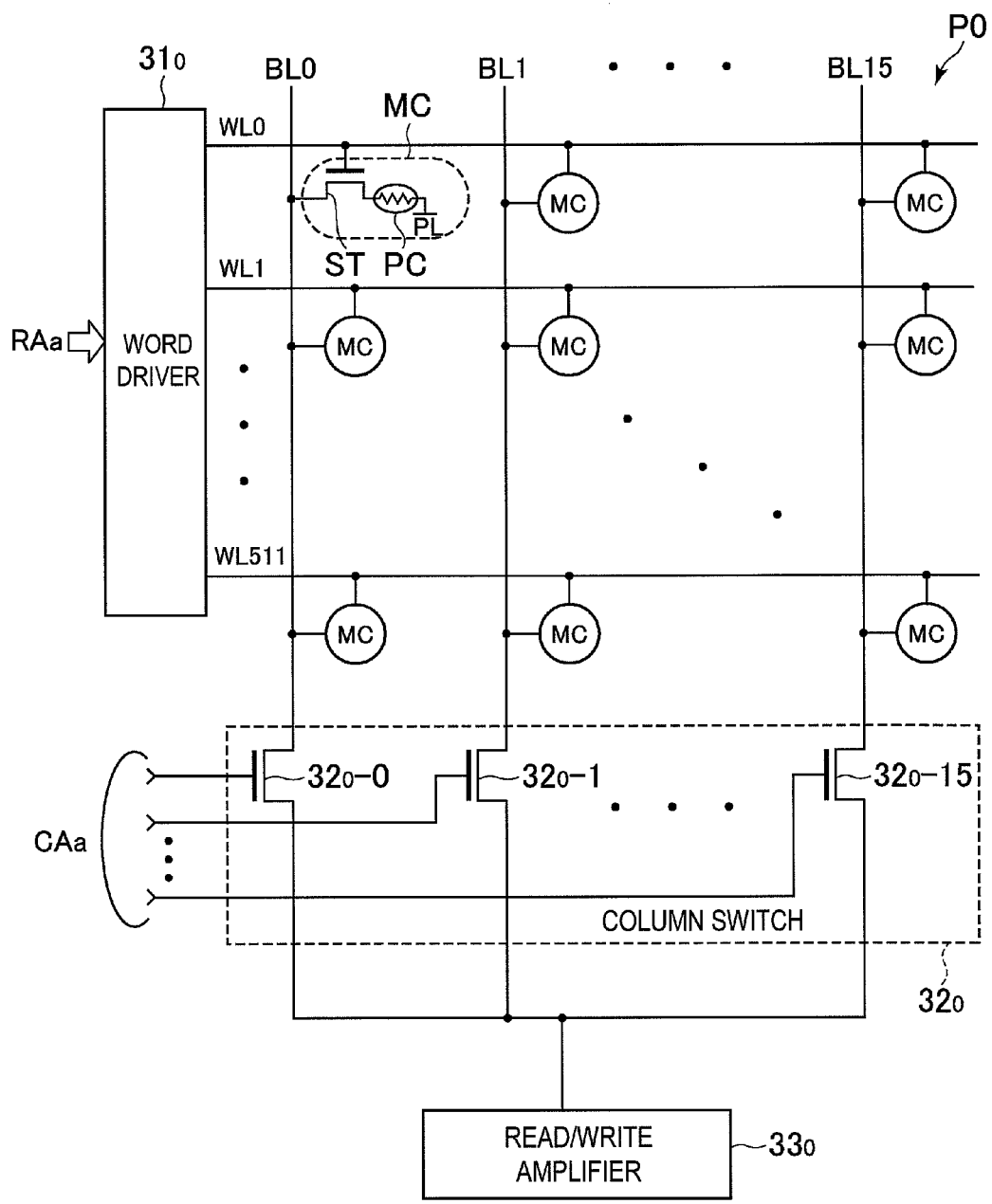
FIG. 3 is a circuit diagram showing a structure of the memory cell array P0.

FIG. 3 is a circuit diagram showing a structure of the memory cell array P0. Other memory cell arrays P1 to P511 also have the same structure as that of the memory cell array P0.

As shown in FIG. 3, the memory cell array P0 includes a plurality of word lines $WL_0$ to $WL_{511}$, a plurality of bit lines $BL_0$ to $BL_{15}$, and a plurality of memory cells MC connected at intersections between the word lines WL and the bit lines BL. Each memory cell MC is configured by a phase-change memory device PC and a selection transistor ST connected in series between a corresponding bit line BLi (i=0 to 15) and the plate wiring PL. A gate electrode of the selection transistor ST is connected to a corresponding word line WLj (j=0 to 511). As a result, when a predetermined word line WLj is activated, a corresponding one of the selection transistor ST is turned on, and thus a current path PC is formed through the phase-change memory device between each of the bit lines $BL_0$ to $BL_{15}$ and plate wirings PL. In each of the memory cells MC shown in FIG. 3, the selection transistor ST is arranged on the bit line BL side and the phase-change memory device PC is arranged on the plate wiring PL side. However, this arrangement can be reversed.

The phase-change memory device PC is one of the variable resistive elements. As a phase change material configuring the phase-change memory device PC, the material is not particularly limited as long as it has two or more phase states and differs in electrical resistance depending on each phase state. However, it is preferable to select a so-called chalcogenide material. The chalcogenide material means an alloy containing at least one or more elements selected from a group consisting of germanium (Ge), antimony (Sb), tellurium (Te), indium (In), selenium (Se) or the like. Examples thereof include: binary elements such as GaSb, InSb, InSe, $Sb_2Te_3$, and GeTe; ternary elements such as $Ge_2Sb_2Te_5$, InSbTe, GaSeTe, SnSb$_2$Te$_4$, and InSbGe; and quaternary elements such as AgInSbTe, (GeSn)SbTe, GeSb(SeTe), and Te$_{81}$Ge$_{15}$Sb$_2$S$_2$.

The phase change material containing the chalcogenide material can take either one of an amorphous phase (a non-crystalline phase) and a crystalline phase. The chalcogenide material is in a relatively high resistance state in the amorphous phase, and is in a relatively low resistance state in the crystalline phase.

To amorphasize (reset) the phase change material, the phase change material can be heated by applying thereto a writing current to a temperature equal to or higher than a melting point, and can then be cooled rapidly thereafter. On the other hand, to crystallize (set) the phase change material, the phase change material can be heated by applying thereto a writing current to a temperature equal to or higher than a crystallization temperature and less than the melting point, and thereafter, the temperature can be gradually cooled. Such application of the writing current is supplied by the read/write amplifier $33_0$. In this way, to write data in each memory cell MC, it is necessary to change the phase state of the phase-change memory device PC. Thu, the PRAM has a characteristic that it takes a long time in its write operation than that of a DRAM.

On the other hand, reading data is performed by passing a reading-out current to the phase-change memory device PC. Application of the reading-out current is also supplied by the read/write amplifier $33_0$. To avoid the occurrence of the phase change, the reading-out current is set to a value sufficiently smaller than the writing current. Accordingly, unlike the DRAM, the memory cell MC can perform nondestructive reading. The phase state of the phase change material does not change unless high heat is applied, and thus data is not lost even after the power supply is disconnected.

As shown in FIG. 3, the word lines WL$_0$ to WL$_{511}$ are connected to the word driver $31_0$, and based on the decode signal RAa, any one of the word lines WL$_0$ to WL$_{511}$ is activated. Moreover, the bit lines BL$_0$ to BL$_{15}$ are connected to the read/write amplifier $33_0$ via switches $32_0$-0 to $32_0$-15 configuring the column switch $32_0$. Control electrodes of the switches $32_0$-0 to $32_0$-15 are supplied each corresponding bit of the decode signal CAa, and thus based on the decode signal CAa, any one of the switches $32_0$-0 to $32_0$-15 is turned on.

According to such a configuration, when the row address RA and the column address CA are determined, any one of the word lines WLj and any one of the bit lines BLi included in the memory cell array P0 are selected, and thus any one memory cell MCij included in the memory cell array P0 is connected to the read/write amplifier $33_0$. As described above, other memory cell arrays P1 to P511 have the same structure as that of the memory cell array P0, and thus the same decode signals RAa and CAa are supplied. As a result, in other memory cell arrays P1 to P511, the memory cell MCij to which the same address is allocated is connected to the read/write amplifiers $33_1$ to $33_{511}$.

Figure 4A:
FIG. 4A is an explanatory diagram of an address allocation in the semiconductor memory device 10.
Figure 4B:
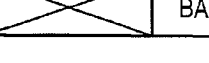
FIG. 4B is an explanatory diagram of an address allocation in a general DRAM.
Figure 5A:
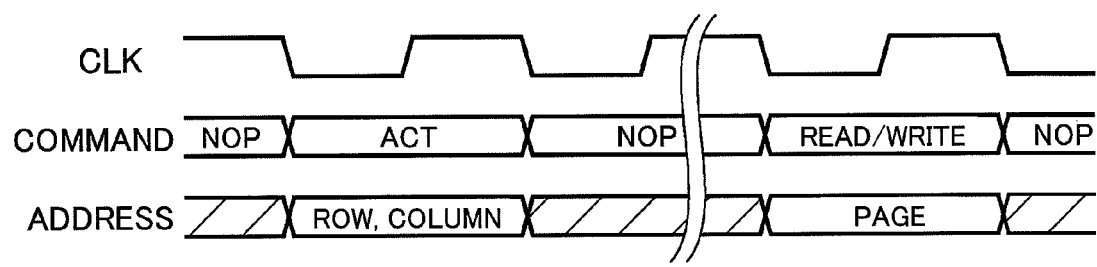
FIG. 5A is a timing chart for explaining an operation control timing of the semiconductor memory device 10.
Figure 5B:
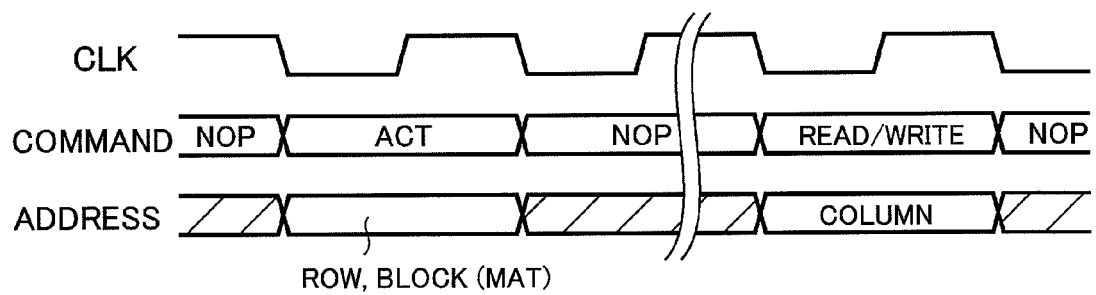
FIG. 5B is a timing chart for explaining an operation control timing of a general DRAM.

FIG. 4A is an explanatory diagram of an address allocation in the semiconductor memory device 10, and FIG. 4B is an explanatory diagram of an address allocation in a general DRAM. In FIGS. 4A and 4B, an address terminal is a 15-bit configuration including A0 to A12, BA0, and BA1. FIG. 5A is a timing chart for explaining an operation control timing of the semiconductor memory device 10, and FIG. 5B is a timing chart for explaining an operation control timing of a general DRAM.

As shown in FIG. 4A and FIG. 5A, an address multiplex system is adopted in the semiconductor memory device 10, and the address is input in two steps. Specifically, in synchronism with the active command, the row addresses RA (A0 to A8), the column addresses CA (A9 to A12), and the bank addresses (BA0 and BA1) are input, and in synchronism with the read command or the write command, the page addresses PA (A1 to A9) and the bank addresses (BA0 and BA1) are input. According to the configuration, by the address that is firstly input, the memory cell MC is selected one each from the memory cell arrays P0 to P511 of a corresponding bank, and by the address that is secondly input, one of the memory cell arrays P0 to P511 of the corresponding bank is selected.

Accordingly, any one of the memory cells MC included in the memory cell array 20 is selected. Accordingly, in a read operation, the read data DQ read via the read/write amplifier 33 from the selected memory cell MC is output to outside, and in a write operation, the write data DQ input from outside is written in the memory cell MC selected via the read/write amplifier 33.

In such an address allocation, there is a complete compatibility with the DRAM address allocation. That is, as shown in FIG. 4B and FIG. 5B, in the DRAM, in synchronism with the active command, the row addresses (A0 to A8), block addresses (A9 to A12), and the bank addresses (BA0 and BA1) are input, and in synchronism with the read command or the write command, the column addresses (A1 to A9) and the bank addresses (BA0 and BA1) are input.

In this way, in the first embodiment, the column address CA is received by utilizing the address terminal at a timing at which the block address should be input in the DRAM, and the page address PA is received by utilizing the address terminal at a timing at which the column address should be input in the DRAM. In other words, the block address output by the memory controller for a DRAM is interpreted as the column address CA, and the column address is interpreted as the page address PA. Thus, from the memory controller side, the semiconductor memory device 10 according to the first embodiment can be handled in an exactly same manner to that of the DRAM.

As described above, the reason why the block address is interpreted as the column address CA and the column address is interpreted as the page address PA is that the array configuration of the semiconductor memory device 10 differs from that of the DRAM.

That is, in a general DRAM, the number of bit lines allocated to one memory block (one memory mat) is relatively large. In the example shown in FIG. 4B, 512 (=2$^9$) bit lines are allocated. Thus, the number of bits of the address for selecting the bit line becomes relatively large. On the other hand, the number of memory blocks (memory mats) included in one bank is relatively small. In the example shown in FIG. 4B, there are 16 (=2$^4$) memory blocks. Thus, the number of bits of the address for selecting the memory block (memory mat) becomes relatively small. The reason for adopting such an array configuration is that an area occupied by one sense amplifier is small in the DRAM, and thus the sense amplifier can be allocated to each bit line pair.

On the other hand, in the semiconductor memory device 10, the number of bit lines allocated to one memory cell array (page) is relatively small, that is 16, and as a result, the number of bits of the column address CA for selecting the bit line requires only four bits. On the other hand, the number of memory cell arrays (pages) included in one bank is relatively large, that is 512. As a result, the number of bits of the page address PA for selecting the memory cell array (page) requires nine bits. The reason for adopting such an array configuration is that in the first embodiment, an area occupied by one read/write amplifier is large, and thus it is not realistic to allocate the read/write amplifier to each bit line pair, and instead, the single read/write amplifier is allocated to each memory cell array.

As a result of such a difference in the array configuration, in the semiconductor memory device 10, the number of bits (nine bits) of the page address PA is larger than the number of bits (four bits) of the column address CA, and thus, as described above, it becomes reasonable to perform access control by interpreting the block address in the DRAM as the column address CA and interpreting the column address as the page address PA.

Moreover, as compared to the DRAM, the semiconductor memory device 10 takes a long time in its write operation, and thus, in the array configuration of the first embodiment in which a plurality of bit lines share one read/write amplifier, when the address allocation similar to that of the DRAM is performed, it becomes difficult to perform continuous access realized by switching the column addresses CA. On the other hand, in the semiconductor memory device 10, the access control is performed such that the column address in the DRAM is interpreted as the page address PA, and thus, similarly to the DRAM, it becomes possible to continuously input the read command or the write command after the active command is input.

Figure 6:
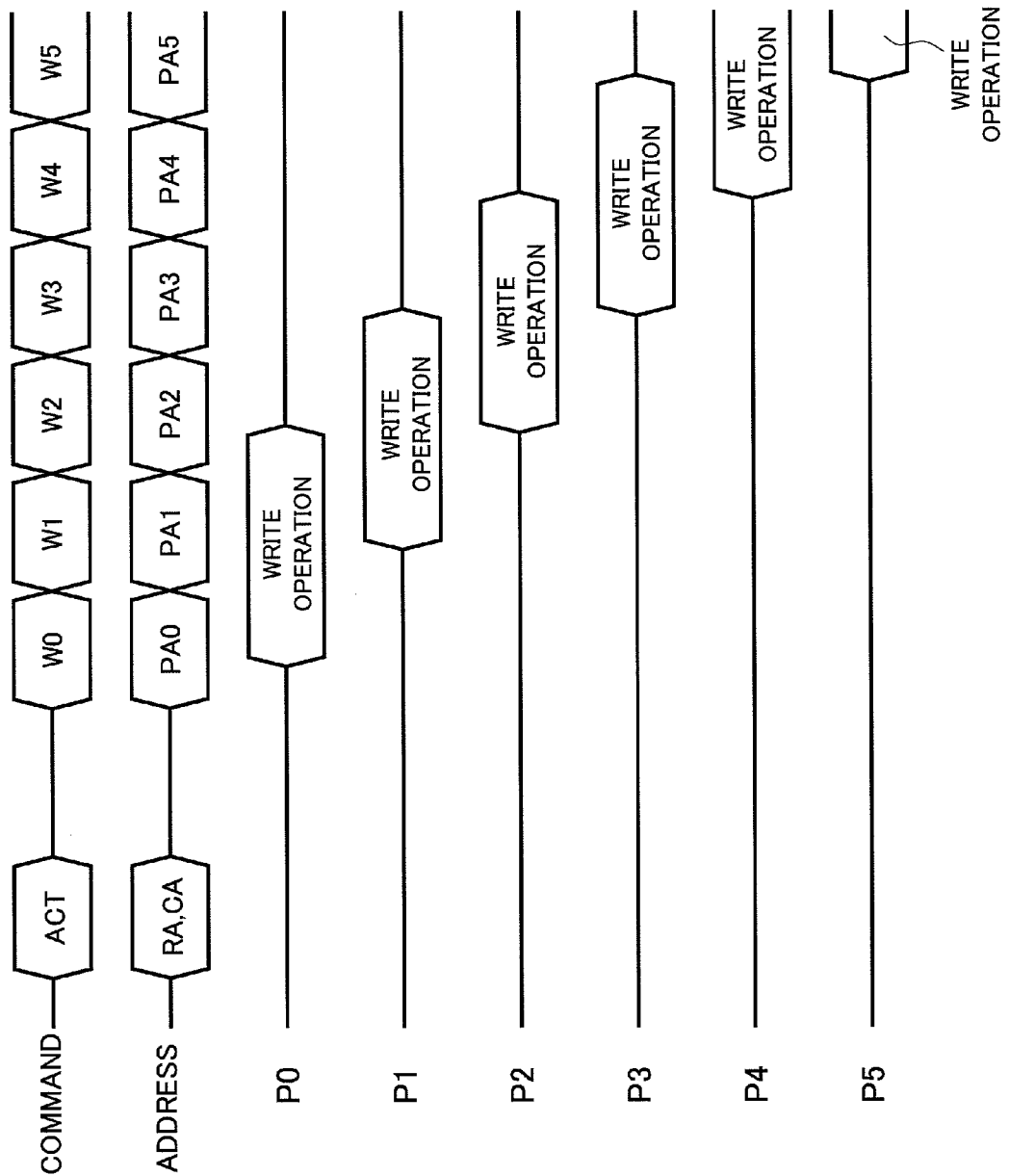
FIG. 6 is a timing chart showing an operation when a write command is continuously input after an active command is input.

FIG. 6 is a timing chart showing an operation when a write command is continuously input after an active command is input.

As shown in FIG. 6, when a write command W0 and a page address PA0 are input after the active command ACT, the row address RA, and the column address CA are input, the write data DQ is written in a predetermined memory cell MC included in the memory cell array P0. Thereafter, when write commands W1, W2, W3, . . . , and page addresses PA1, PA2, PA3, . . . , are continuously input, selections of the read/write amplifier 33 by the page address decoder 43 are continuously switched while a selection state of the column switch 32 is maintained. Thus, the write data DQ is continuously written in the predetermined memory cell MC included in memory cell arrays P1, P2, P3, . . . .

In this way, according to the address allocation of the first embodiment, the write data DQ that should be continuously written is always allocated to the different memory cell arrays (pages) P0 to P511. Thus, one of the read/write amplifiers $33_0$ to $33_{511}$ alone does not continuously perform the write operation, and the different read/write amplifiers $33_0$ to $33_{511}$ always operate in parallel. Thus, although a single write operation takes a longtime as compared to the DRAM, it becomes possible to continuously input the write command, in a similarly manner to that of a DRAM. Needless to mention, the read command can be also input continuously.

As described above, in the semiconductor memory device 10 according to the first embodiment, it is possible to secure a compatibility with a DRAM although the bit lines share one read/write amplifier.

Figure 7:
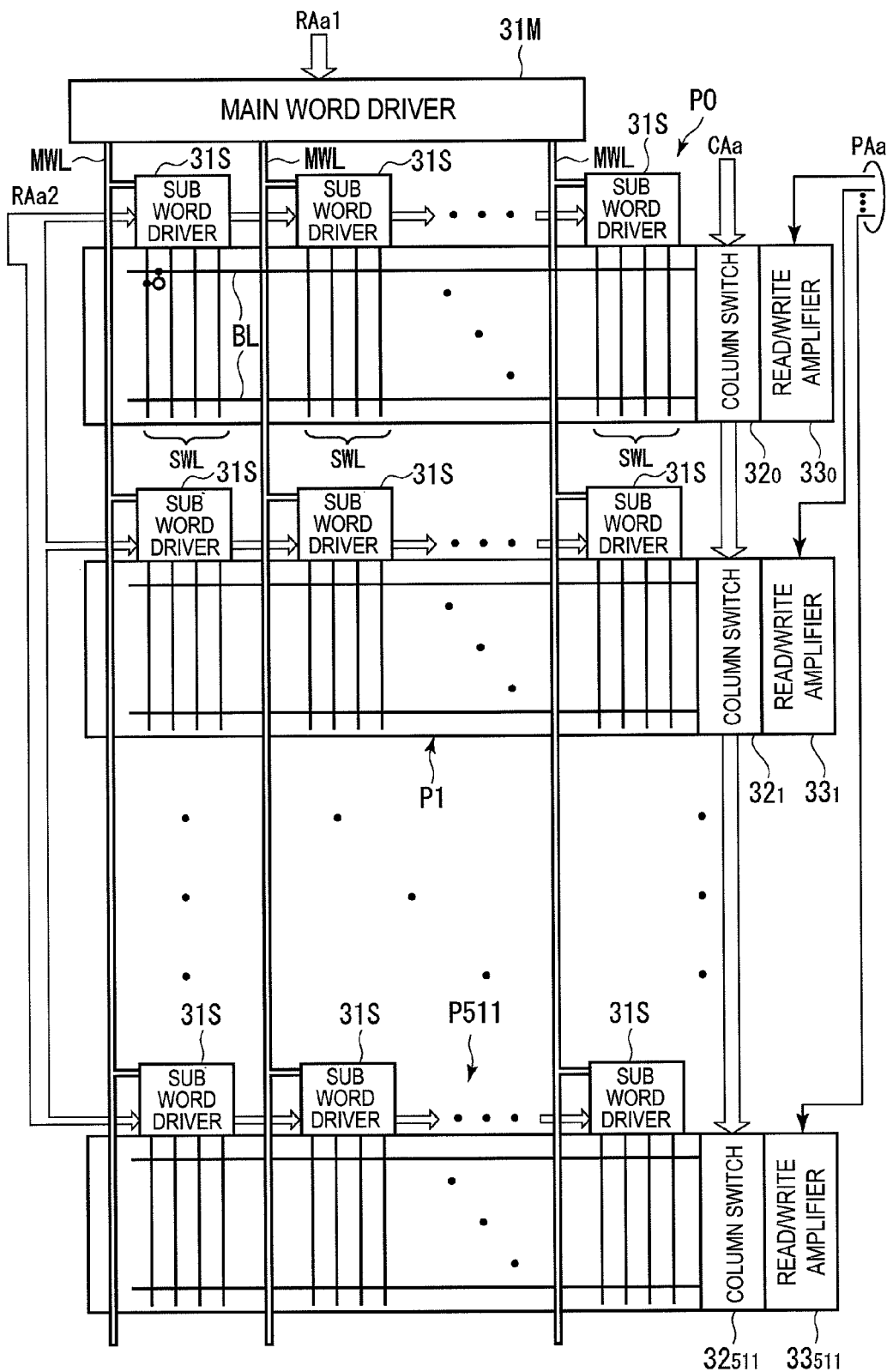
FIG. 7 shows a second embodiment of the present invention.

FIG. 7 shows a second embodiment of the present invention.

As shown in FIG. 7, in the second embodiment, each word line is hierarchized into a main word line MWL and a sub word line SWL, and the main word line MWL is shared by the memory cell arrays P0 to P511. The main word line MWL is driven by a main word driver 31M based on a predecode signal RAa1. Moreover, the sub word line SWL is driven by a sub word driver 31S based on a predecode signal RAa2. When such a hierarchized structure is adopted, a circuit scale of the word driver 31 can be significantly downsized.

Figure 8:
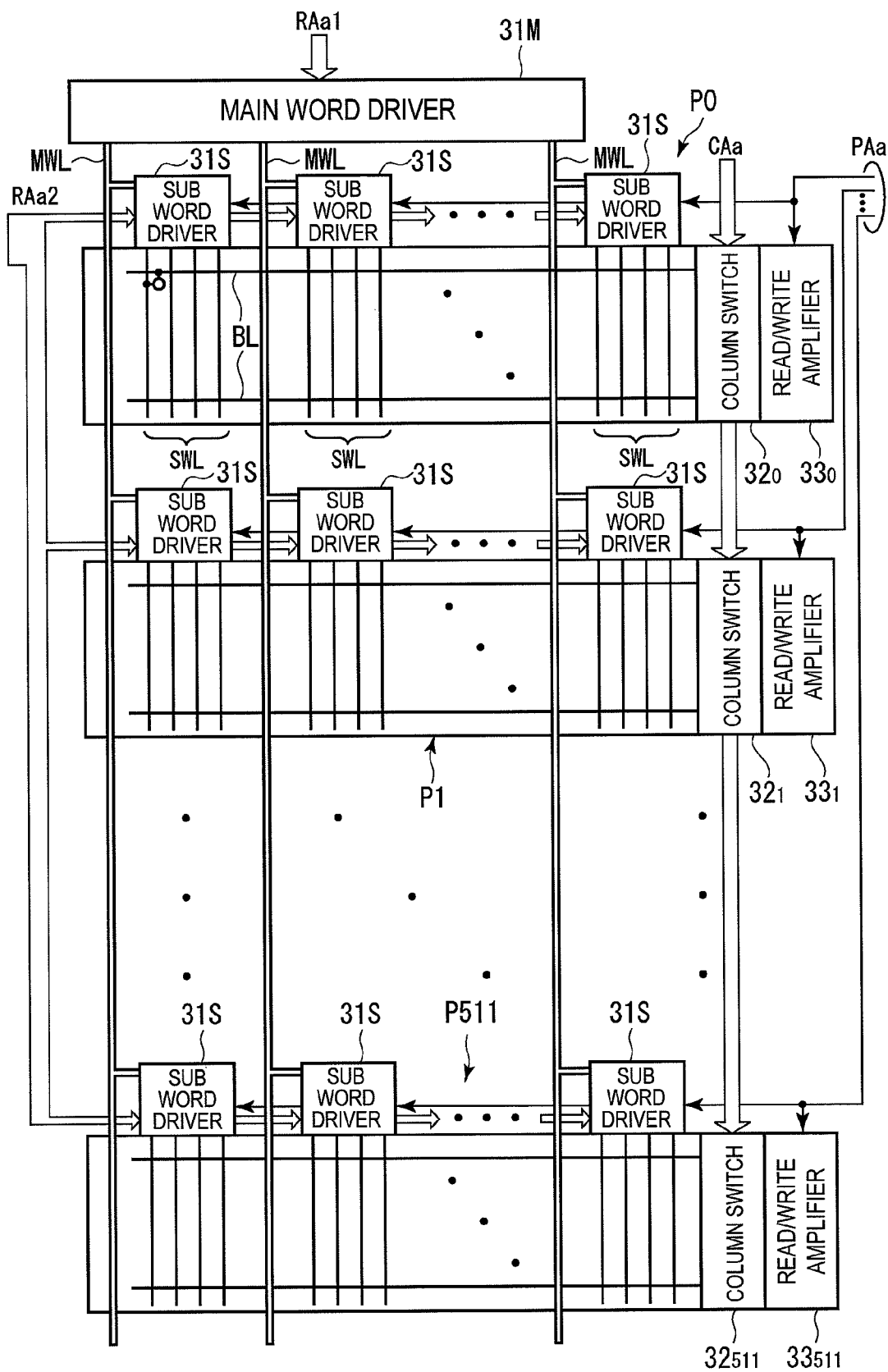
FIG. 8 shows a third embodiment of the present invention.

FIG. 8 shows a third embodiment of the present invention.

As shown in FIG. 8, in the third embodiment, the sub word driver 31S corresponding to each of the memory cell arrays P0 to P511 is each supplied with a corresponding bit of the decode signal PAa. Other features of the third embodiment are identical to those of the second embodiment shown in FIG. 7, and thus like elements are denoted by like reference numerals, and redundant explanations thereof will be omitted.

The sub word driver 31S drives the sub word line SWL when the corresponding bit of the decode signal PAa is activated. Therefore, the sub word line SWL is activated in synchronism with the selection of the read/write amplifier 33 by the page address decoder 43 after the page address PA is determined. According to such a configuration, only the sub word driver 31S of the page on which a read operation or a write operation is actually performed is selectively operated, and thus the power consumption can be reduced more as compared to the configuration shown in FIG. 7.

Figure 9:
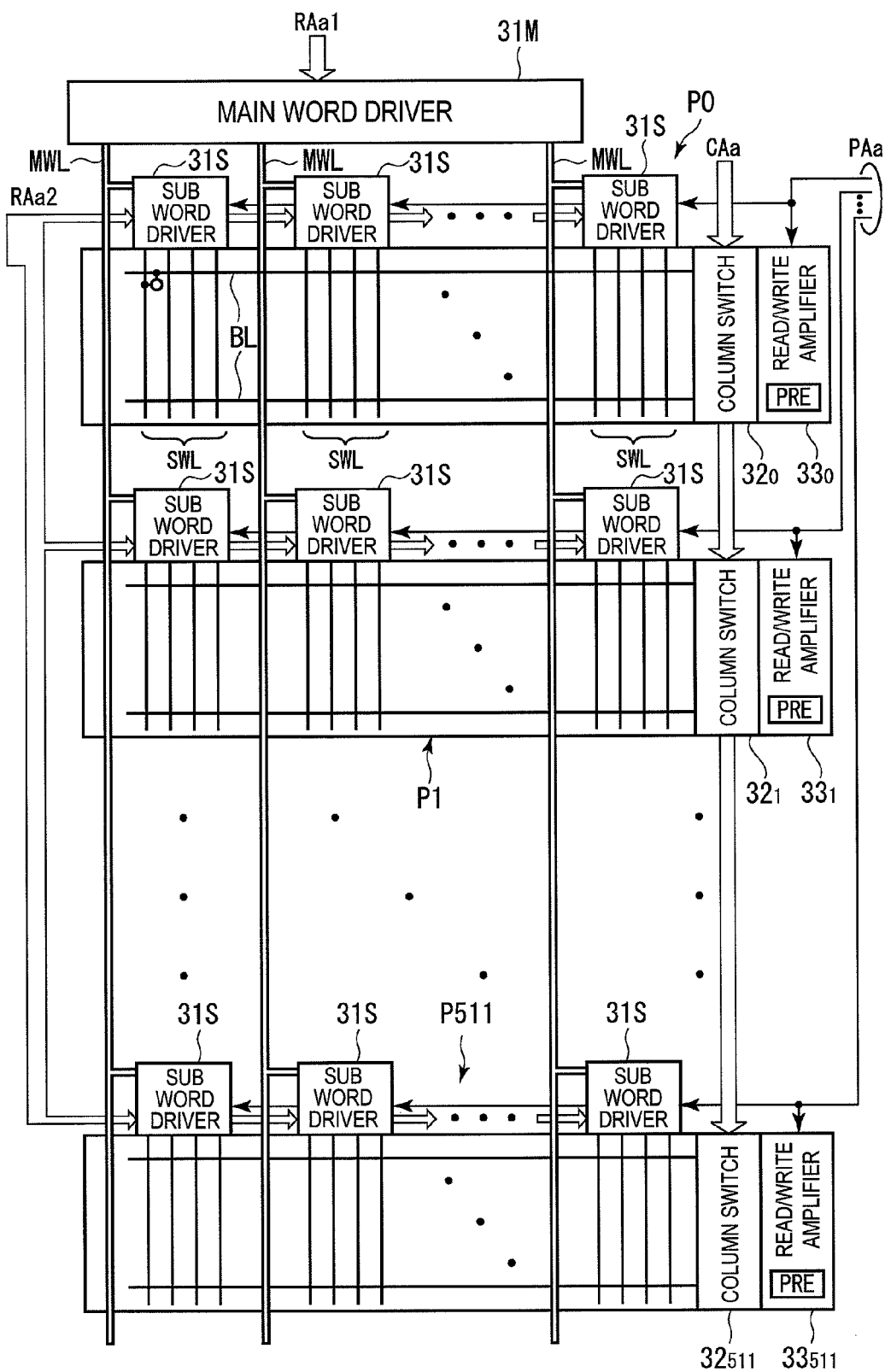
FIG. 9 shows a fourth embodiment of the present invention.

FIG. 9 shows a fourth embodiment of the present invention.

In the fourth embodiment, precharge circuits PRE are arranged in the read/write amplifiers $33_0$ to $33_{511}$ as shown in FIG. 9. Other features of the fourth embodiment are identical to those of the third embodiment shown in FIG. 8, and thus like elements are denoted by like reference numerals, and redundant explanations thereof will be omitted. Each precharge circuit PRE precharges the bit line BL connected to the memory cell MC which is a target for writing, and starts a precharge operation in response to issuance of the write command.

Figure 10:
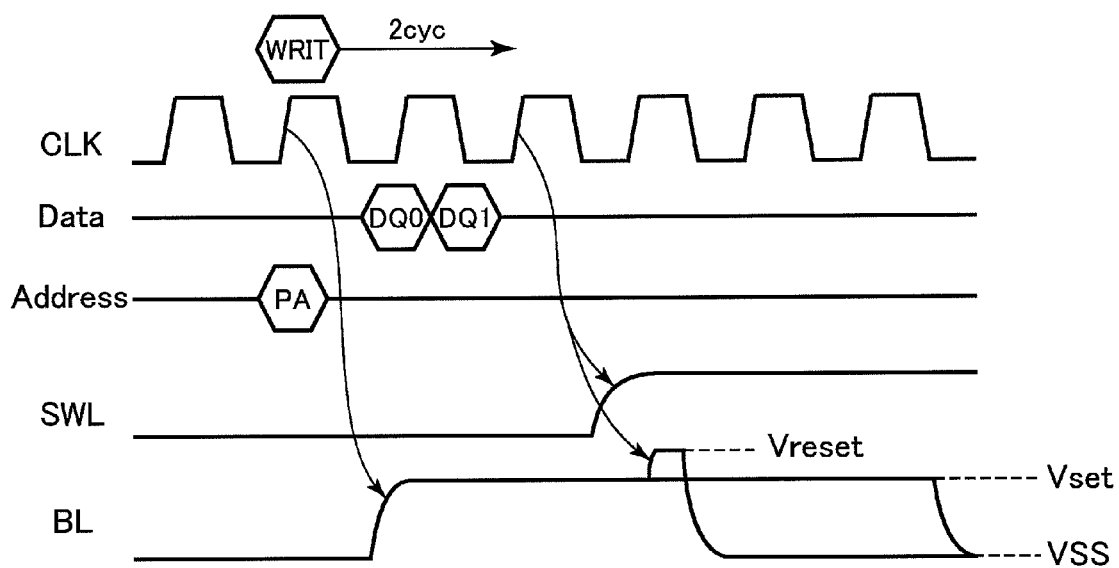
FIG. 10 is a timing chart for explaining a write operation in the fourth embodiment.

FIG. 10 is a timing chart for explaining a write operation in the fourth embodiment.

As shown in FIG. 10, in the fourth embodiment, when the write command is issued, the bit line is precharged up to a level required for a set operation (a set voltage Vset), irrespective of a logical level of the write data DQ. The set voltage Vset should be applied to the bit line when the phase-change memory device PC is crystallized, and is higher than a voltage (read voltage) that should be applied to the bit line during a read operation. In the fourth embodiment, irrespective of the logical level of the write data DQ, the selected bit line is precharged to the set voltage Vset, and thereafter, depending on the logical level of the write data DQ, the set operation or a reset operation is performed.

Thereby, when the logical level of the write data DQ actually indicates the set operation, it is possible to quickly set the memory cell MC because the bit line has already been precharged to the set voltage Vset.

On the other hand, when the logical level of the write data DQ indicates the reset operation, it is necessary to change the bit line up to a level required for the reset operation (a reset voltage Vreset). The reset voltage Vreset should be applied to the bit line when the phase-change memory device PC is amorphized, and is higher than the set voltage Vset. However, in this case also, because the bit line has already been precharged to the set voltage Vset, the read/write amplifier 33 can just change the bit line from the set voltage Vset to the reset voltage Vreset. The memory cell MC can be quickly reset because a difference between the set voltage Vset and the reset voltage Vreset is about 1 V.

The reason why such bit line precharge is possible is only because the column address CA is determined at a time point at which the active command is issued. That is, unlike the DRAM, the column address CA is determined before the write command is issued, and thus the bit line can be immediately precharged in response to issuance of the write command. This enables shortening a time that is from the issuance of the write command of the bit line to a start of actual writing of the write data DQ.

Figure 11:
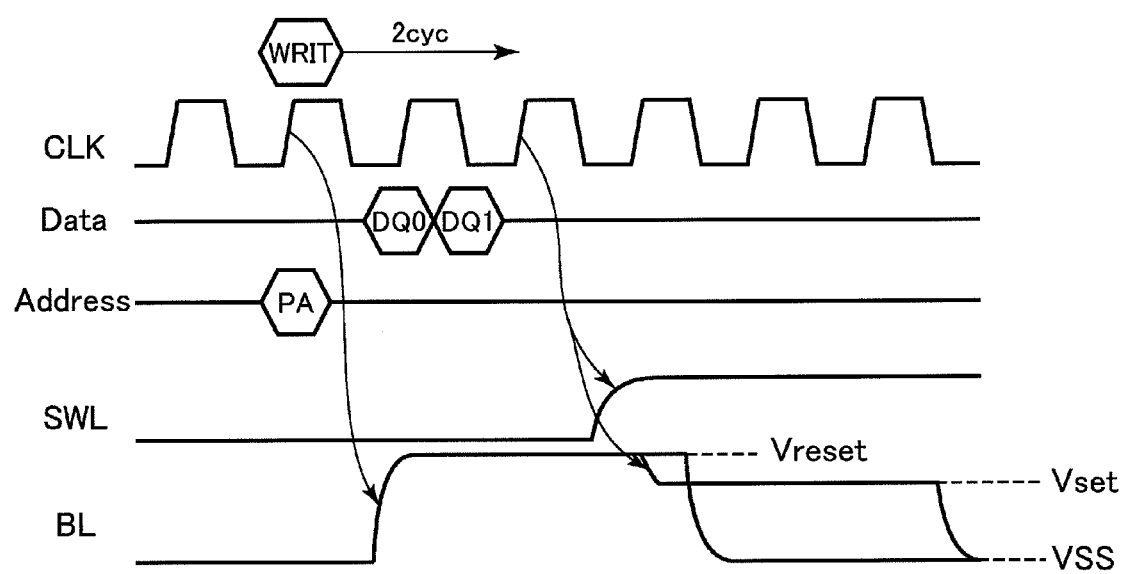
FIG. 11 is a timing chart for explaining another example of a write operation in the fourth embodiment.

In the fourth embodiment, irrespective of the logical level of the write data DQ, the selected bit line is precharged to the set voltage Vset. However, as shown in FIG. 11, irrespective of the logical level of the write data DQ, the selected bit line can be precharged to the reset voltage Vreset. In this case, when the logical level of the write data DQ indicates the set operation, the bit line needs to be lowered to the set voltage Vset. However, as described above, the difference between the set voltage Vset and the reset voltage Vreset is about 1 V, and thus it is possible to quickly change to the set voltage Vset.

Figure 12:
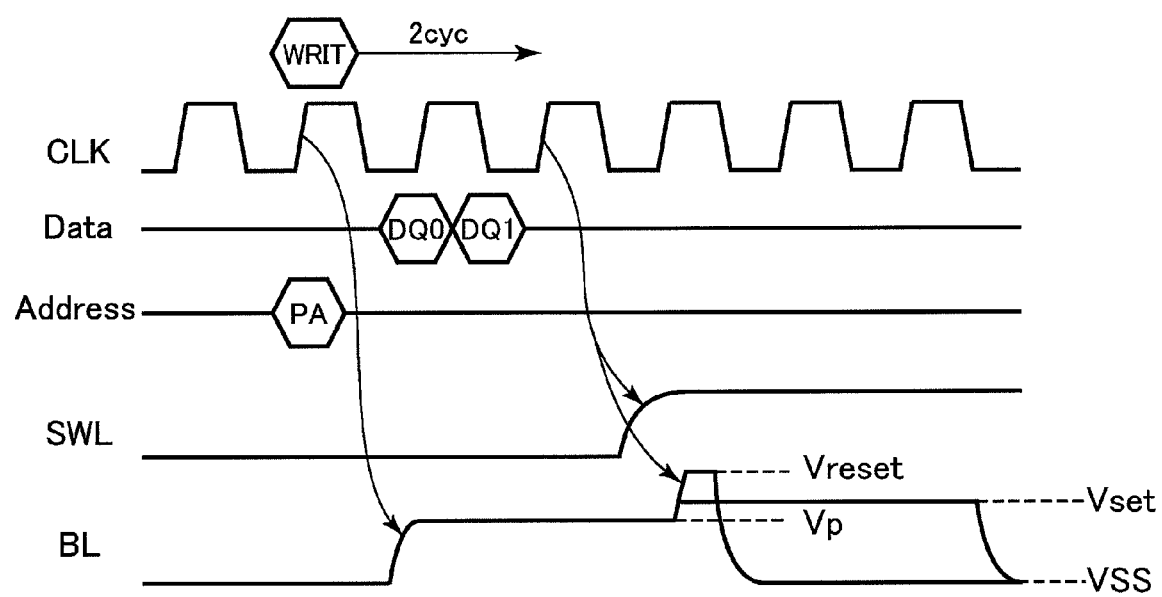
FIG. 12 is a timing chart for explaining still another example of a write operation in the fourth embodiment.

Moreover, as shown in FIG. 12, irrespective of the logical level of the write data DQ, the selected bit line can be precharged to a voltage Vp different from the set voltage Vset and the reset voltage Vreset. In the example shown in FIG. 12, the selected bit line is precharged to a voltage slightly lower than the set voltage Vset. In this case, after the logical level of the write data DQ is determined, the bit line needs to be changed from the precharge voltage Vp to the set voltage Vset or the reset voltage. However, when the precharge voltage Vp is set to near the set voltage Vset or the reset voltage Vreset, it is possible to quickly change the bit line to the set voltage Vset or the reset voltage.

Figure 13:
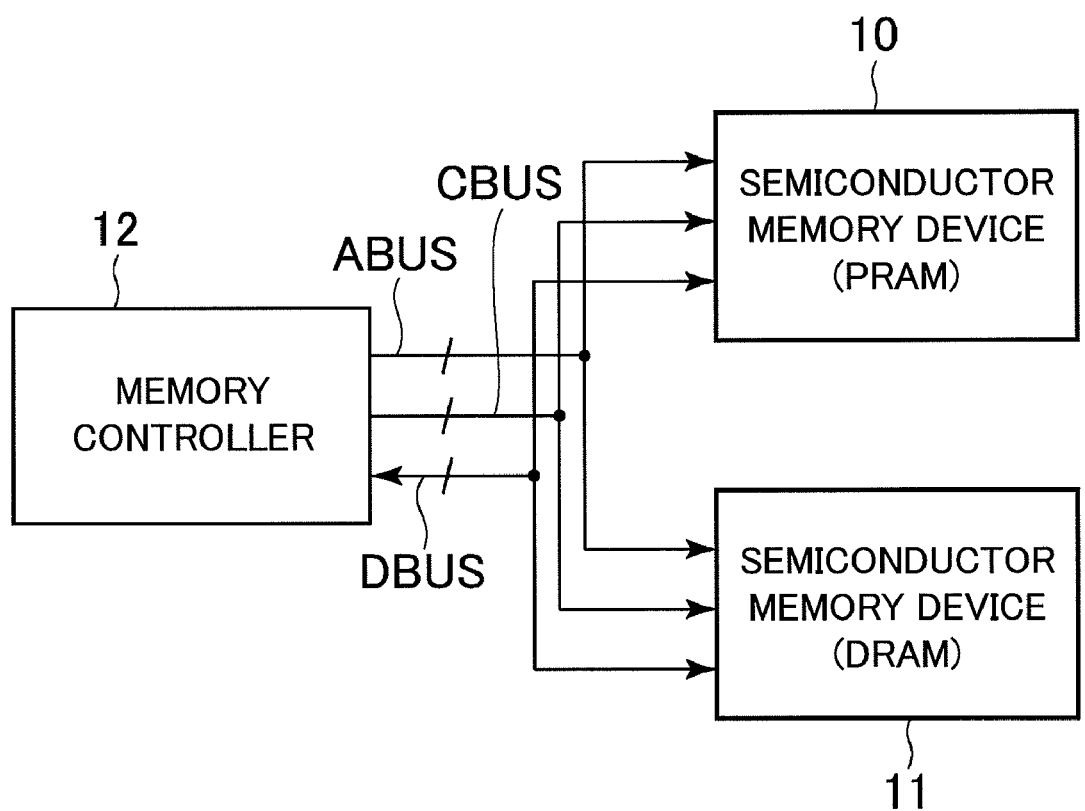
FIG. 13 is a block diagram of a data processing system according to another embodiment of the present invention.

FIG. 13 is a block diagram of a data processing system according to another embodiment of the present invention.

The data processing system shown in FIG. 13 includes the semiconductor memory device (PRAM) 10, a semiconductor memory device (DRAM) 11, and a memory controller 12 that controls these components. The memory controller 12, the PRAM 10, and the DRAM 11 are mutually connected by an address bus ABUS, a command bus CBUS, and a data bus DBUS. That is, the address bus ABUS, the command bus CBUS, and the data bus DBUS are commonly arranged to the PRAM 10 and the DRAM 11. Needless to mention, wirings that supply some signals such as a chip selection signal are individually wired to the PRAM 10 and the DRAM 11.

In this way, in the semiconductor memory device (PRAM) 10 according to the above embodiments, a compatibility with the DRAM 11 is secured, and thus the semiconductor memory device (PRAM) 10 and the DRAM 11 can be mixed and used. The address allocation in the DRAM 11 is already described with reference to FIG. 4B. That is, based on the block address (the mat address) and the row address simultaneously input in synchronism with the active command, any one of the memory cell arrays and any one of the word lines included in the selected memory cell array are respectively selected, and based on the column address input in synchronism with the read command or the write command, any one of the bit lines is selected.

Needless to mention, it is not essential to use the PRAM 10 and the DRAM 11 in a mixed manner, and a memory module can be configured by the PRAMs 10 in plural. Even in this case, as the memory controller 12, it is possible to use a memory controller for a DRAM. In this way, a need of using a memory controller dedicated to a PRAM is eliminated, and thus it becomes possible to reduce development costs and design costs.

It is apparent that the present invention is not limited to the above embodiments, but may be modified and changed without departing from the scope and spirit of the invention.

For example, while the application of the present invention to the PRAM is described as an example in the above embodiments, the application target of the present invention is not limited thereto. The present invention can also be applied to other types of semiconductor memory devices such as an RRAM (Resistance Random Access Memory). Each memory cell of a RRAM includes a variable resistive element made of a magnetic resistance material in which an electrical resistance is changed when a voltage pulse is applied. Therefore, when the present invention is applied to the RRAM, a writing voltage can be used instead of the writing current supplied to each memory cell MC in the above embodiments. In the present invention, the writing current and the writing voltage are collectively called "writing signal".

In the above embodiments, one read/write amplifier is arranged for each page. However, it is not essential that the amplifier arranged for each page is the read/write amplifier. Either one of the read amplifier or the write amplifier can be selected. For example, one write amplifier can be arranged for each page, and the read amplifier can be arranged for each bit line.

The memory controller 12 in the data processing system according to the present invention includes semiconductor chips such as a CPU (Central Processing Unit), MCU (Micro Control Unit), DSP (Digital Signal Processor), ASIC (Application Specific Integrated Circuit), and ASSP (Application Specific Standard Circuit). The data processing system can be applied to semiconductor devices such as an SOC (system on chip), MCP (multiple chip package), and POP (package on package) including the memory controller 12, the semiconductor memory device 10, and the semiconductor memory device 11.

What is claimed is:

1. A semiconductor memory device comprising:
    a plurality of memory cell arrays each including a plurality of word lines, a plurality of bit lines, and a plurality of memory cells each located at an associated intersection between the word lines and the bit lines; and
    an address selecting circuit that selects any one of the word lines and any one of the bit lines in each memory cell array based on first and second addresses provided in synchronism with a first command, and selects any one of the memory cell arrays based on a third address provided in synchronism with a second command issued after the first command.

2. The semiconductor memory device as claimed in claim 1, further comprising a plurality of amplifiers each assigned to an associated one of the memory cell arrays, wherein
    the address selecting circuit includes a word driver that activates any one of the word lines based on the first address, a column switch that connects any one of the bit lines to a corresponding one of the amplifiers based on the second address, and a page address decoder that selects any one of the amplifiers based on the third address.

3. The semiconductor memory device as claimed in claim 2, wherein the word driver is activated in synchronism with a selection of the amplifier by the page address decoder.

4. The semiconductor memory device as claimed in claim 3, wherein
    each of the amplifiers includes a precharge circuit that precharges a selected bit line to a writing voltage, and
    the precharge circuit starts precharging the selected bit line in response to issuance of a write command as the second command.

5. The semiconductor memory device as claimed in claim 1, wherein number of the memory cell arrays included in one bank is larger than number of the bit lines included in one memory cell array.

6. The semiconductor memory device as claimed in claim 1, wherein the memory cell includes a variable resistive element capable of changing a resistance value based on a writing signal supplied via the bit line.

7. A data processing system comprising:
a memory controller that simultaneously supplies first and second addresses in synchronism with issuance of a first command and supplies a third address in synchronism with issuance of a second command; and
the semiconductor memory device connected to the memory controller, wherein
the semiconductor memory device includes:
a plurality of memory cell arrays each including a plurality of word lines, a plurality of bit lines, and a plurality of memory cells each located at an associated intersection between the word lines and the bit lines; and
an address selecting circuit that selects any one of the word lines and any one of the bit lines in each memory cell array based on the first and second addresses provided in synchronism with the first command, and selects any one of the memory cell arrays based on the third address provided in synchronism with the second command issued after the first command,
the semiconductor memory device receives the first address as a row address, receives the second address as a column address, and receives the third address as a page address.

8. The data processing system as claimed in claim 7, further comprising a DRAM connected to the memory controller, wherein
the DRAM includes a plurality of memory cell arrays each including a plurality of word lines, a plurality of bit lines, and a plurality of memory cells each located at an associated intersections between the word lines and the bit lines, and
any one of the memory cell arrays and any one of the word lines included in a selected memory cell array are selected based on the first and second addresses, and any one of the bit lines is selected based on the third address.

9. The data processing system as claimed in claim 8, wherein the semiconductor memory device and the DRAM are connected to the memory controller via a common address bus.

10. The data processing system as claimed in claim 7, wherein the semiconductor memory device further includes a plurality of amplifiers each assigned to an associated one of the memory cell arrays,
the address selecting circuit includes a word driver that activates any one of the word lines based on the first address, a column switch that connects any one of the bit lines to a corresponding one of the amplifiers based on the second address, and a page address decoder that selects any one of the amplifiers based on the third address.

11. The data processing system as claimed in claim 10, wherein the word driver is activated in synchronism with a selection of the amplifier by the page address decoder.

12. The data processing system as claimed in claim 11, wherein
each of the amplifiers includes a precharge circuit that precharges a selected bit line to a writing voltage, and
the precharge circuit starts precharging the selected bit line in response to issuance of a write command as the second command.

13. The data processing system as claimed in claim 7, wherein number of the memory cell arrays included in one bank is larger than number of the bit lines included in one memory cell array.

14. The data processing system as claimed in claim 7, wherein the memory cell includes a variable resistive element capable of changing a resistance value based on a writing signal supplied via the bit line.

15. A semiconductor memory device comprising:
a plurality of bit lines that are connected to memory cells each including a phase-change memory element and that are classified into a plurality of pages;
a plurality of amplifiers each assigned to associated bit lines belonging to a same page;
a plurality of column switch groups arranged in each of the pages, the column switch groups connecting any one of the bit lines belonging to the same page to a corresponding one of the amplifiers;
a column address decoder that commonly controls the column switch groups based on a first address provided in synchronism with a first command;
a row address decoder that commonly controls word drivers connected to any one of a plurality of word lines based on a second address provided in synchronism with a first command; and
a page address decoder that selects any one of the amplifiers based on a third address provided in synchronism with a second command.

16. The semiconductor memory device as claimed in claim 15, wherein the page address decoder successively changes a selection of the amplifiers with maintaining the column switch groups in an active state when the second commands are successively issued after the first command is issued.

* * * * *